United States Patent [19]

Sato

[11] Patent Number: 4,680,675
[45] Date of Patent: Jul. 14, 1987

[54] PRINTED CIRCUIT BOARD TERMINAL DEVICE

[75] Inventor: Hideo Sato, Kanagawa, Japan

[73] Assignee: Sony Corporation, Tokyo, Japan

[21] Appl. No.: 725,814

[22] Filed: Apr. 22, 1985

[30] Foreign Application Priority Data

Apr. 25, 1984 [JP] Japan .................................. 59-83332

[51] Int. Cl.⁴ ............................................. H05K 7/06
[52] U.S. Cl. ..................... 361/397; 174/68.5;
361/398; 361/400; 361/404; 361/408; 361/409
[58] Field of Search .............. 174/68.5, 88 R, 117 PC;
361/397–398, 400, 403, 404, 406, 408–409, 426,
421; 339/17 E, 17 R

[56] References Cited

U.S. PATENT DOCUMENTS

| 3,248,779 | 5/1966 | Yuska et al. ..................... 361/408 X |
| 3,648,116 | 3/1972 | Baugher et al. ................. 361/421 X |
| 4,407,007 | 9/1983 | Desai et al. ..................... 174/68.5 X |
| 4,581,673 | 4/1986 | Pang ........................................ 361/91 |

FOREIGN PATENT DOCUMENTS 0065425 11/1982 European Pat. Off. ............ 361/398

Primary Examiner—Arthur T. Grimley
Assistant Examiner—Jane K. Lau
Attorney, Agent, or Firm—Hill, Van Santen, Steadman & Simpson

[57] ABSTRACT

A printed circuit terminal device which includes a terminal array having very fine pitch between lead lines from a circuit portion including a flexible printed circuit board having a terminal array pattern which corresponds to the terminal array and wiring pattern and which are arranged to alternately extend from two sides of the terminal array pattern thus changing the pitch of the wiring pattern on the flexible printed circuit board to be twice that of the pitch of the wiring pattern of the terminal array. This allows a circuit to be easily and reliably coupled to the electrical terminals having very fine pitch and the formation of the wiring pattern of a coupling portion with the circuit portion can be easily performed and results in an arrangement of very small size. The flexible printed circuit board can be manufactured at low cost and the yield can be increased. Also, circuit elements such as resistors can be mounted on the wiring pattern without changing the wiring pitch.

1 Claim, 15 Drawing Figures

PRINTED CIRCUIT BOARD TERMINAL DEVICE

BACKGROUND OF THE INVENTION

1. Field of the Invention

This invention relates in general to a printed circuit board terminal device and particularly to a terminal device suitable for use with a plasma display panel.

2. Description of the Prior Art

Plasma display panels of X-Y matrix type are known as means for displaying characters or images. An x-electrode group comprising the data electrodes comprise anodes to which high and low voltages are applied corresponding to the display data. A y-electrode group which are the scanning electrodes comprises cathodes which are scanned in line sequential manner with a native voltage pulse.

An inner drive circuit for such plasma display panels comprises shift registers 10A and shift register 10B and a drive stage for converting the serial display data into parallel data as illustrated in FIG. 1. However, if the integration density of the discharge electrodes is increased so as to improve the resolving power of a display panel, the number of stages of the shift register will be increased according to the increase in the number of anodes and the transfer speed of the shift register becomes inadequate.

In view of this fact, the display data is converted into two bit parallel data and then is supplied to parallel shift registers 10A and 10B as illustrated in FIG. 2. For this arrangement, the parallel output lines of the shift registers 10A and 10B must be alternately arranged so that they can be connected to extending portions of the anodes of the display panel as shown in FIG. 2. Electrical connections between the circuit and the panel is generally accomplished with a flexible printed circuit board on which drive ICs are mounted. For this reason, with the arrangement of FIG. 2, both surfaces of the printed circuit board must be provided with patterns and the inserting portion of lines must be formed using plated through holes which results in high cost and low reliability.

With the arrangement illustrated in FIG. 1 when the electrodes are arranged so that they have a very fine pitch between them, the pitch p of a connecting terminal 11 of a flexible printed circuit board will become so narrow to reach the limit of manufacturing as is illustrated in FIG. 3. For this reason the conductor lines 12 between an integrated circuit 10 and the terminal 11 must be formed so that the conductor lines extend out from at least two side portions as illustrated in FIG. 3. Therefore, the size of the flexible printed circuit board will be large as compared to the width W of the actual plasma panel.

Also, as illustrated in FIG. 4, since discharge load resistors R must be inserted in the lines 12 between the anode drivers and the anodes, the pattern pitch of the resistor attaching portion must be increased and therefore it is difficult to mount the anode drive circuit on the flexible printed circuit board which has the same size as the plasma panel.

SUMMARY OF THE INVENTION

The present invention solves the above problems and has as its object to improve a printed circuit board terminal device so that it can be easily and reliably coupled to electrode terminals having very fine pitch and so as to reduce the wiring area thereby achieving highly integrated circuit mounting.

According to the present invention, a printed circuit board terminal device which couples a terminal array having fine pitch and lead lines from a circuit portion comprises a flexible printed circuit board having a terminal array pattern corresponding to the terminal array and wiring patterns which are arranged to alternately extend on both sides of the terminal array pattern. The terminal array and the terminal array pattern are overlaid so that they can be electrically connected to each other and the wiring patterns are connected to the circuit portion and are divided into two sections. This structure allows low cost high reliability and highly integrated mounting arrangements.

Other objects, features and advantages of the invention will be readily apparent from the following description of certain embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
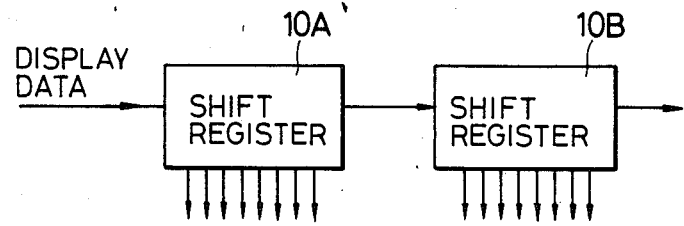
FIGS. 1 and 2 are prior art circuit diagrams of an anode drive circuit for a plasma display panel to which a printed circuit board terminal device is applied.
Figure 2:
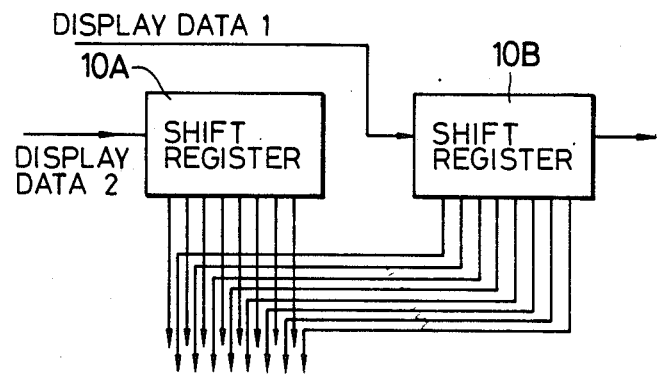
Figure 3:
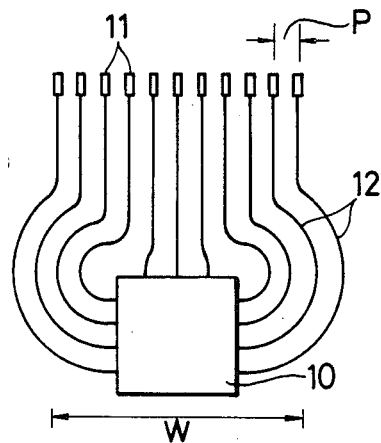
FIGS. 3 and 4 are partial plan views showing a structure of a conventional connecting pattern.
Figure 4:
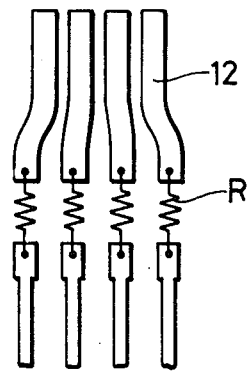
Figure 5:
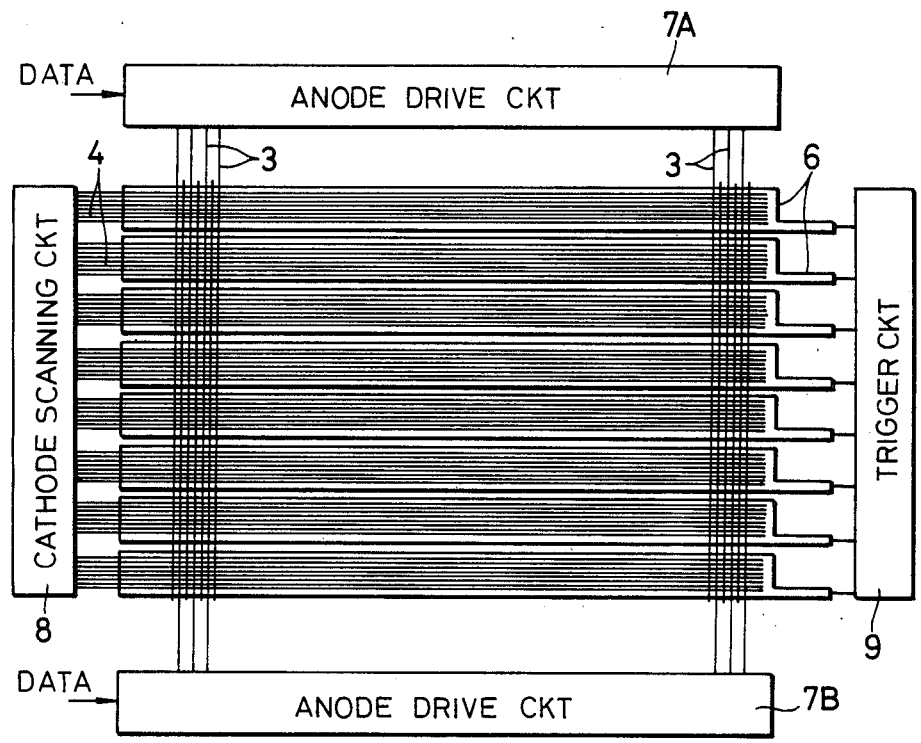
FIG. 5 is a plan view schematically illustrating a plasma display panel to which the present invention can be applied.
Figure 6:
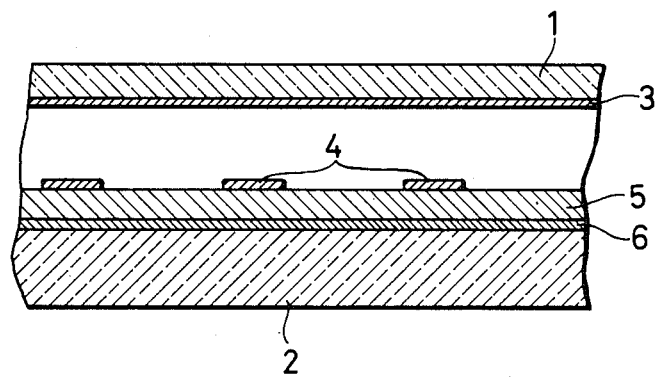
FIG. 6 is a partial sectional view of FIG. 5.

FIG. 5 is a schematic plan view illustrating a plasma display panel PDP to which a printed circuit board terminal device of the present invention is applied. FIG. 6 is a partial sectional view of the plasma display panel which comprises a front glass panel 1 separated from a rear glass panel 2. Anodes 3 which are the data electrodes and cathodes 4 which are the scanning electrodes are mounted between the glasses 1 and 2 and extend in x-y matrix form and are spaced with small discharge gaps therebetween. Trigger electrodes 6 are divided into a plurality of phases as, for example, eight phases and are arranged under and parallel to the cathodes 4.

Alternate ones of the anodes are coupled to upper drive circuit 7A and the other alternate anodes 3 are coupled to a lower drive circuit 7B. Data voltage having either high level ("1") or low level ("0") corresponding to the display data is supplied to the anodes 3 in synchronizm with scanning of the cathodes using a shift register with parallel switching outputs derived from output switching elements in drive circuits 7A and 7B according to the desired display data input which is in serial form.

A negative voltage is applied to the cathodes 4 by cathode scanning circuit 8 from a lower side to a higher side in a line sequential manner. A discharge is produced between the selected cathode 4 and a selected anode 3 to which a high voltage is applied.

The trigger electrode 6 are driven by a trigger circuit 9 in a phase sequential manner and high voltage trigger pulses are supplied to the trigger electrode 6 in synchronizm with the cathodes scanning timing. Trigger discharges which induce discharge are generated between the trigger electrode 6 and the opposing cathodes 4 and a breakdown voltage between the anode 3 and the cathode 4 is decreased by spatial ions due to the discharge thereby inducing a main discharge between the anode 3 and the cathode 4.

Figure 7:
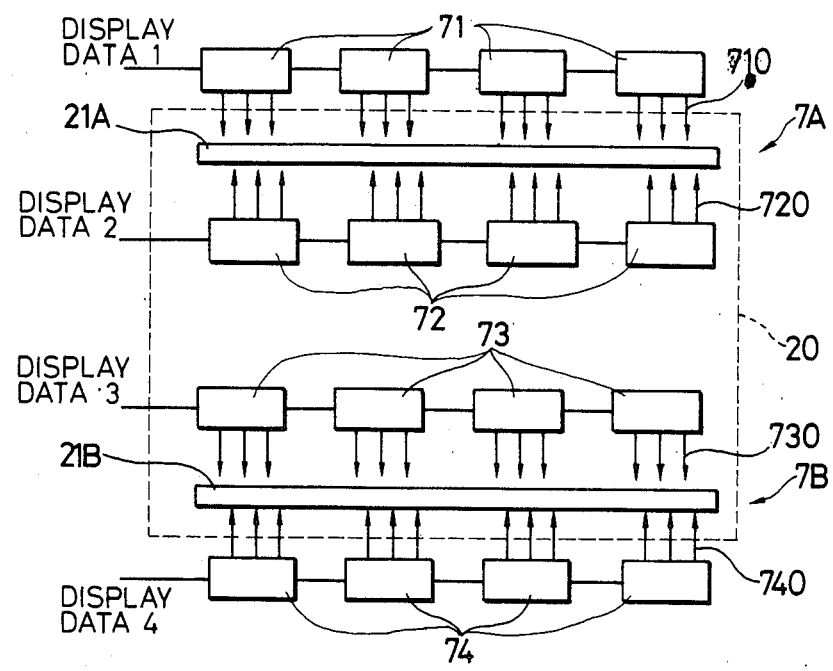
FIG. 7 is a circuit diagram of an anode drive circuit of FIG. 5 showing a circuit configuration of a printed circuit board terminal device according to an embodiment of the present invention.

FIG. 7 illustrates schematically the anode drive circuit 7A and 7B of FIG. 5 according to the present invention and the outer dimensions of the display panel 20 is indicated by the dashed line. Lead terminal sections 21A and 21B for the anodes 3 are mounted at upper and lower edges of the display panel 20 as illustrated. The drive circuits 7A is separated into drivers 71 and drivers 72 which are mounted on opposite sides of the lead terminal section 21A and two-bit parallel display data 1 and 2 are supplied to the corresponding drivers as illustrated. The drive circuit 7B is also separated into drivers 73 and drivers 74 which are mounted on opposite sides of the lead terminal section 21B as illustrated and two-bit parallel display data 3 and 4 are supplied thereto. Thus, in this example, four-bit parallel display data is supplied to the drivers.

The drivers 71 through 74 comprise shift registers and driver transistors which are driven by parallel output of the shift registers and are formed by several integrated circuits. Signal output lines 710 for the drivers 71 are alternately connected to the lead terminal section 21A one by one. In likewise fashion, the signal output line 720 of the drivers 72 are individually connected to the lead terminals section 21A as shown. Furthermore, the drivers 73 are connected by signal output lines 730 to the lead terminal section 21B one by one and the drivers 74 are connected by output signal line 740 to the lead terminal sections 21B of the panel 20. The pitch pattern of the signal output lines 710, 720 and 730 and 740 is twice that of the lead terminal section 21A and 21B of the panel 20 because the output lines extend to the lead terminal sections 21A and 21B from opposite sides thereof as illustrated.

Figure 8:
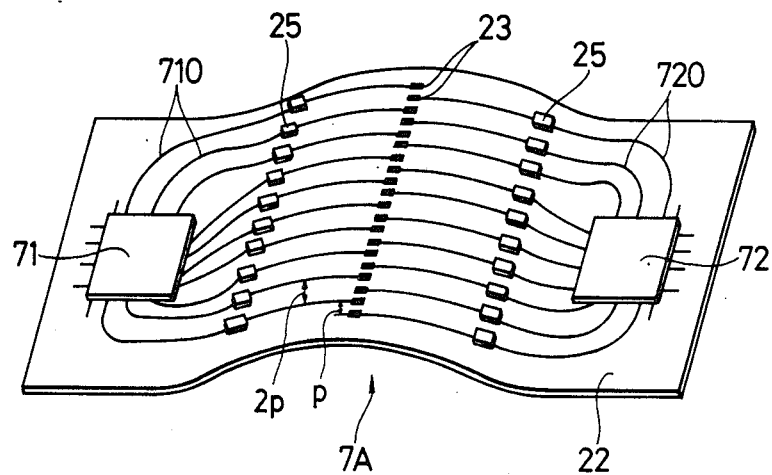
FIG. 8 is a perspective view showing the printed circuit board terminal device according to an embodiment of the present invention.
Figure 9:
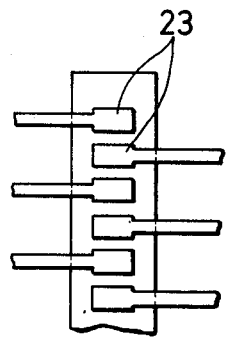
FIG. 9 is an enlarged partial plan view showing a wiring pattern of FIG. 8 in detail.

FIG. 8 is a perspective view illustrating the method of mounting the upper drive circuit 7A. The integrated circuits constituting the driver 71 and 72 and the signal output lines 710 and 720 are provided on a single surface of a flexible printed circuit board 22 as illustrated. Between the drivers 71 and 72 terminal patterns 23 are formed with the same pitch as the terminals of the lead terminal sections 21A and 21B of the panel 20 shown in FIG. 7. A detail partial view of the terminal patterns 23 are illustrated in FIG. 9. The terminal patterns 23 are alternately connected to the signal output lines 710 and 720 from the drivers 71 and 72.

Figure 10:
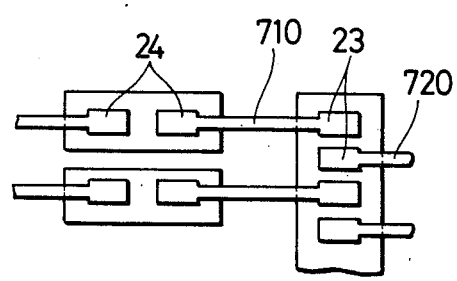
FIG. 10 is an enlarged partial plan view of a wiring pattern of the circuit of FIG. 8.

There must be mounted in line 710 and 720 line patterns 24 for discharge load resistors which are shown in detail in FIG. 10. Shift resistors 25 are formed thereon as illustrated in FIG. 8. The resistors 25 may be printed film resistors. Since the pattern pitch of the signal output lines 710 and 720 is twice that of the pitch of the terminal patterns 23, the mounting or printing space for the resistors 25 can be maintained without increasing the pattern pitch.

Figure 11:
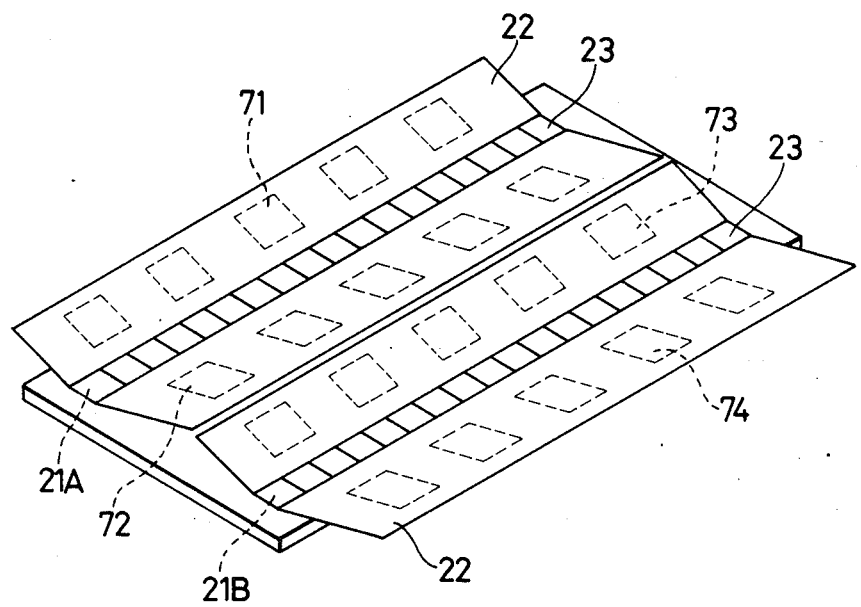
FIG. 11 is a perspective view illustrating the method of mounting a flexible printed circuit board illustrated in FIG. 8.

FIG. 11 is a perspective view illustrating the mounting method for the flexible printed circuit board 22 on the display panel 20. The printed circuit board 22 illustrated in FIG. 8 is turned over and connected such that the terminal patterns 23 coincide with the terminals of the lead terminal sections 21A and 21B.

Figure 12:
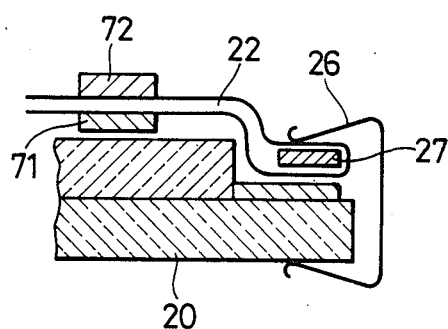
FIG. 12 is an enlarged partial sectional view showing a method of connecting electrode terminals.

The method of coupling can be to press couple using elastic spacers 27 and a press spring member 26 as shown in partial sectional view in FIG. 12. It is to be seen that the flexible printed circuit board 22 is doubled over around the elastic spacer 27 and the spring 26 clamps the flexible printed circuit board through the display panel 20 as shown. It is to be noted that the drivers 71 and 72 will be arranged as illustrated in FIG. 12.

It is to be realized, of course, that the terminal patterns 23 engage the associated terminal patterns of the lead terminal sections 21A.

Figure 13:
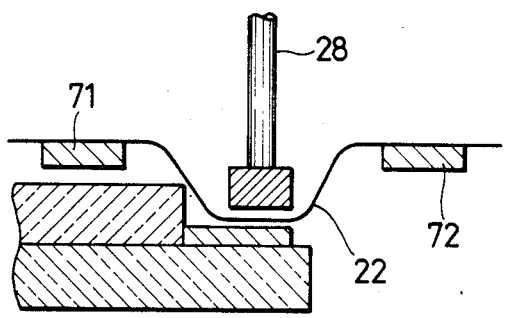
FIG. 13 is an enlarged partial sectional view illustrating an alternative method of connecting electrode terminals.

An alternate method of coupling is illustrated in FIG. 13 wherein the flexible printed circuit board 22 is soldered to the display panel 20 using a soldering tool 28. After the flexible printed circuit board 22 has been attached to the display panel 20 then it can be bent over to the form illustrated in FIG. 12 with a driver 72 adjacent the driver 71.

Figure 14:
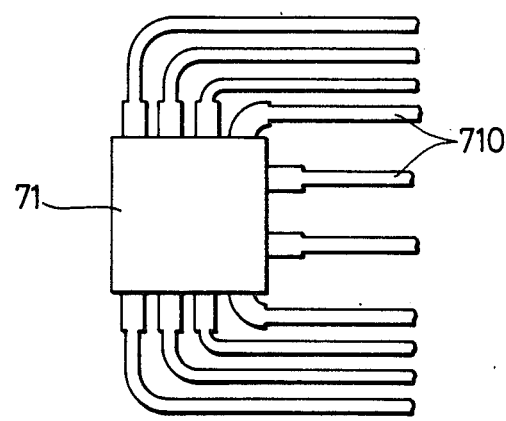
FIG. 14 is a partial plan view illustrating a circuit portion of FIG. 8 in detail.

According to the above description in the invention, since the pitch of the pattern of the signal output lines 710 to 740 from the driver circuits (ICs) is twice the conventional pitch of the lead terminal section 21A and 21B increased reliability and an increased yield for manufacturing can be obtained. FIG. 14 is a detailed view of an IC portion of the driver 71 and since the output lines need not be alternately inserted they can be directly connected to the terminal patterns 23 without using lead wiring. A high density integration within a small area is realized and the width of the printed circuit board 22 can be the same size or smaller than that of the display panel 20.

It is to be noted that after the flexible printed circuit board 22 has been connected to the terminal portions of the display panel 20 it can be folded as illustrated in FIG. 12. Space for mounting the drive circuits can be very small. The fixed positions of the ICs constituting the driver 71 and 72 can be shifted so as to avoid vertical overlapping each other which allows a flatter structure. Alternately, as illustrated in FIG. 12, the ICs of the driver 71 can be fixed on the back surface of the pattern of the flexible printed circuit board 22 so that they extend in the same direction and are aligned as shown.

Figure 15:
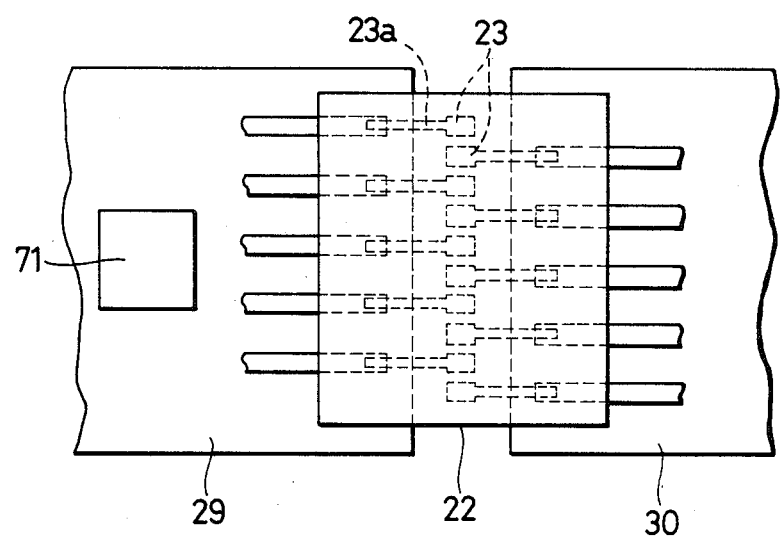
FIG. 15 is a partial plan view illustrating a modification of the printed circuit board device of the invention.

FIG. 15 is a partial plan view illustrating a modification of the invention wherein the ICs of the drivers 71 and 72 are mounted on a normal glass epoxy printed circuit board 29 or 30 and the terminal patterns 23 and lead connectors 23a are partially formed on the flexible printed circuit board 22. The printed circuit boards 29 and 30 are soldered to the flexible printed circuit board 22 and the pitch pattern on the boards 29 and 30 are large which gives good operation and reliability. Mounting of the boards on the display panel is accomplished in the same manner as illustrated in FIG. 11 and after mounting the flexible printed circuit board 23 is folded as illustrated in FIG. 12 so that the printed circuit boards 29 and 30 overlay each other on the backside of the display panel 20.

Thus, it is seen that this invention provides means for doubling the pitch of output leads on a flexible printed circuit board and extending them toward each other from opposite directions so that they can be connected to a circuit terminal wherein the pitch is one-half of that of the pitch of the leads extending from opposite directions on the flexible printed circuit board.

Although the invention has been described with respect to preferred embodiments, it is not to be so limited as changes and modifications can be made which are withn the full intended scope of the invention as defined by the appended claims.

I claim as my invention:

1. A planar printed circuit board of flexible material upon which a first driver and a second driver are mounted and at least one lead terminal section is formed with terminal patterns which extend in a planar line and are closely spaced and have a pitch "p", a first plurality of planar signal output lines formed on one side of said one lead terminal section and extending parallel to each other with pitch of "2p" and connected to a first group of alternate ones of said terminal patterns on said one lead terminal section and connected to said first driver and said first signal output lines and said first group of alternate ones of said terminal patterns lying in a first plane, and a second plurality of planar signal output lines formed on a second side of said one lead terminal section and extending parallel to each other with a pitch of "2p" and connected to a second group of planar alternate ones of said terminal patterns on said one lead terminal section and connected to said second driver and said second signal output lines and said second group of terminal patterns lying in a second plane, wherein a first portion of said printed circuit board upon which said first driver is mounted can be bent so as to lie in a different plane from said lead terminal section, wherein a second portion of said printed circuit board upon which said second drive is mounted can be bent so as to lie in a different plane from said lead terminal section, with a first plurality of resistors mounted on said printed circuit board in series with said first plurality of signal output lines, and a second plurality of resistors mounted on said printed circuit board in series with said second plurality of signal output lines.

* * * * *